United States Patent [19]

Imamura et al.

[11] 3,958,066

[45] May 18, 1976

[54] CONDUCTIVE SYNTHETIC FIBERS

[75] Inventors: Kazuyoshi Imamura; Tatsuo Ishikawa; Tetsuhiro Kusunose, all of Nobeoka, Japan

[73] Assignee: Asahi Kasei Kogyo Kabushiki Kaisha, Osaka, Japan

[22] Filed: May 31, 1973

[21] Appl. No.: 365,497

[30] Foreign Application Priority Data

June 8, 1972 Japan................................ 47-56444

[52] U.S. Cl................................. 428/372; 317/2 C; 427/180; 427/205; 427/316; 427/343; 428/373; 428/389; 428/394; 428/395

[51] Int. Cl.²........................................ D06M 11/12

[58] Field of Search................ 117/31, 62, 138.8 R, 117/138.8 F, 138.8 N, 169 R, 223, 224, 225, 227; 161/174, 175; 317/2 C; 427/180, 205, 316, 343; 428/372, 373, 394, 395, 389

[56] References Cited

UNITED STATES PATENTS

| | | | |
|---|---|---|---|
| 2,566,441 | 9/1951 | Camras | 161/175 |
| 3,399,070 | 8/1968 | Scharf | 161/175 |
| 3,492,142 | 1/1970 | Sanders et al. | 161/174 |
| 3,579,409 | 5/1971 | Shannon | 161/174 |
| 3,582,445 | 6/1971 | Okuhashi | 161/174 |
| 3,586,597 | 6/1971 | Okuhashi | 161/175 |
| 3,589,956 | 6/1971 | Kranz et al. | 161/175 |

*Primary Examiner*—J. C. Cannon
*Attorney, Agent, or Firm*—Armstrong, Nikaido & Wegner

[57] ABSTRACT

Thermoplastic synthetic polymer fibers having powder of metal attached to the surface of the fibers are subjected to a treatment for increasing the oxidation number of said metal from zero to a plus value, that is, oxidation in a broad sense. The resulting conductive synthetic fibers support a layer of a compound of the metal, i.e. an oxidized product of the metal in a broad sense, firmly and undetachably thereon, and have as low an electric resistivity as $10^5 \Omega/cm$ or less. The conductive fibers can be blended to ordinary synthetic fibers to improve their antistatic property, or can be substituted for expensive metal fibers. The thermoplastic synthetic polymer fibers are sheath-core fibers wherein the sheath has a lower melting point than the core.

11 Claims, 3 Drawing Figures

CONDUCTIVE SYNTHETIC FIBERS

DESCRIPTION OF THE DISCLOSURE

This invention relates to synthetic organic polymer fibers having electric conductivity (hereinafter referred to simply conductivity) and a method for producing same. More particularly, this invention relates to synthetic organic polymer fibers having an electric resistivity of $10^5$ ohm/cm or less whose surface is covered by a firmly coated layer of a metal compound which are useful for eliminating static electricity of fibrous products by incorporating into common synthetic fibers and can be used in the application field which conventional synthetic fibers could not have entered e.g. raw materials of substitute fibers for expensive metal fibers.

General purpose synthetic organic fibers such as polyamide fibers, polyester fibers, acrylic polymer fibers, polypropylene fibers, etc. show electric resistivity greater than $10^{10}$ohm/cm and hardly allow a current to flow therethrough. Harmful effect of static electricity in the products of synthetic fibers is due to this property.

There are various methods for eliminating the harmful effect of static electricity, but a method which relies on the blending of conductive fibers (fibers having a good electric conductivity) into products of synthetic fiber is not only applicable easily in the stage of manufacture of fibrous products starting from fibers but also satisfactory in the practical antistatic effect and their durability. In the blending methods of conductive fibers, metal fibers are ideal raw materials in the points of conductivity and their durability. However, since metal fibers are not suitable for mass production, they are not commercially advantageous raw materials. Further they are inferior in the mechanical properties and properties necessary for processing at the time of blending into fibrous products.

It is also known that antistatic products which are not inferior to metal fiber-containing products can be obtained by incorporating, in place of metal fibers, fibers whose conductivity is improved by introducing conductive substances in the inside of or on the surface of general-purpose synthetic organic polymer fibers, into fibrous products, e.g. carpets, sewing machine thread or the like.

As for such manufacturing methods of conductive synthetic fibers, there has been employed a method in which a layer of simple substance of a metal is formed on the surface of fibers by a chemical plating method, an electroplating method, a metallizing method or the like. However, the chemical plating method can produce improved fibers having a large conductivity but poor durability, but requires complicated pretreatment steps such as surface corrosion, sensitization, activation or the like, resulting in a drawback of high cost of products.

Electroplating method is liable to bring about unevenness of deposit of metal due to uneven current density and accompanied with technical difficulty in applying to fibers.

Metallizing method has a drawback in the point that a metal coating is liable to be peeled off on account of poor adhesive strength.

At any rate, these physical or chemical methods are not adequate as methods for modifying general purpose synthetic fibers into conductive fibers, cheaply in a commercial production.

Further, there is a method in which fine powders of conductive substance are incorporated with a synthetic organic polymer and the resulting blend is subjected to spinning. However, in order to obtain a value of electric resistivity in the order of $10^5$ $\Omega$/cm by this blending and spinning method, it is necessary to incorporate more than 50% by weight of powder of conductive substance such as metal powder or the like. (See B. E. Gyjib, Research and Application of Conductive Polymers, translated into Japanese by Tadatoshi Sadamasa, published by Yokokawa Shoin). Thus, the method is not an adequate one for shaping fine practical fibers.

Besides, there are known a method in which metal powder as conductive fine powder is attached by melting onto the surface of thermoplastic polymer fibers, or a method in which metal powder is blended with a thermosetting resin and fibers are coated with the resulting blend, but it is impossible to obtain fibers having an electric resistivity of $10^5$ $\Omega$/cm or less unless secondary processing property, and handle (flexibility and softness) are sacrificed. In other words, according to the metal adhesion method, if metal is made to adhere in an amount of more than 50% by weight based on the weight of fibers, a conductivity of $10^5$ $\Omega$/cm or less can be obtained, but the thickness of the coating film becomes greater, and in case of multifilament yarns, there is a drawback of cohesion of monofilaments into a cord-like form.

It is an object of the present invention to provide synthetic fibers having superior, durable conductivity by utilizing a method of adhesion of metal powder.

It is another object of the present invention to provide a method for producing synthetic fibers having a conductivity of $10^5$ $\Omega$/cm or less in an extremely simple manner.

We have found a phenomenon that synthetic organic polymer fibers whose surface is coated with metal powder show unexpectedly a low conductivity, but when these fibers are placed in the atmosphere in which a metal is oxidized, the conductivity is increased. Surprising enough, it is possible according to this method to obtain fibers having as low an electric resistivity as $10^2$ to $10^5$ ohm/cm which is comparable to that of the fibers having a continuous metal layer, obtained according to chemical plating method.

Thus, the present invention lies in conductive synthetic fibers (1) having a coating layer of a metal compound (a metal oxide in a broad meaning) firmly and undetachably supported on the surface of synthetic organic thermoplastic polymer fibers having substantially no conductivity, and (2) showing an electric resistivity of $10^5$ ohm/cm or less. (Said synthetic organic thermoplastic polymer fibers will be hereinafter referred to simply as thermoplastic synthetic fibers.) The metal compound layer on the surface of fibers, is firmly supported and not detached easily by abrasion, washing, etc. It is a feature of the present invention that the above-mentioned firm support is caused by strong bonding state of the compound on the surface of the fibers, but not by the action of bonding of high molecular weight substances.

Thermoplastic synthetic fibers herein referred to are those of melt-spinnable polymers such as polyamides, polyesters, polyolefins, etc. Particularly, polyamide fibers have excellent adhesiveness to metals and metal compounds and hence conductive fibers having superior durability, i.e. superior abrasion-resistance and washing-resistance can be obtained therefrom.

The metal compound of the present invention is defined as a compound of a metal whose oxidation number is changed from zero to a plus value, that is, an oxidized product of metal in a scientifically broad meaning.

In other words, the metal compound is a product obtained by oxidizing a metal directly with an oxidizing agent, in a broad meaning. As for the oxidizing agent, hydrogen sulfide, oxygen, $O_2$-containing gas such as air, halogen, hydrogen peroxide, a mixture of carbon dioxide, water and air or oxygen, etc. can be illustrated. The oxidation is liable to occur in the presence of water. Oxidation or oxidation treatment referred to herein is used in the broad meaning unless otherwise noted. Further, the metal compound must not be soluble in water or dry-cleaning solvents.

Preferable metal compounds of the present invention include sulfides, oxides and carbonates of copper, zinc, lead, silver, aluminum, iron and the alloys of the foregoing metals. Compounds which yield more preferable results are sulfides and oxides. These sulfides and oxides are also preferable in view of the simplicity of treatment and the performance of the products.

It is a characteristic point of the present invention that the metal compounds form a coating layer even without any adhesive.

The coating state of the metal compounds in the conductive fibers of the present invention, when observed through an electron microscope, is considerably different in the appearance of powder itself and the fineness of coating, from the coating state of metal powder. See FIGS. 2 and 3 of the accompanying drawings.

In spite of the generally accepted fact that metal compounds are all poorer in conductivity than the simple substances of metals, metal compound-carrying fibers show as low an electric resistance as comparable to those of chemically plated fibers. This is really a surprising fact.

For example, the electric resistivity of fibers on the surface of which copper powder is uniformly attached is $10^{10}$ $\Omega$/cm at the highest, but electric resistivity of fibers after the copper powder is converted into a sulfide with hydrogen sulfide becomes $10$–$10^3$ $\Omega$/cm, that is, the conductivity is remarkably increased.

The reason of this strange phenomenon is not clear, but it is presumed that since the metal is in an oxidized state, it is electrically charged, and as the result, molecules of water, carbon dioxide, etc. in the air possessing polarity, are secondarily coordinated with the particles of the metal therebetween to promote the flow of current.

The amount of the metal compound made to adhere is $10^{-8}$ g/m or more as converted into the weight of the metal, per filament of common range of denier. In this case, an electric resistivity of $10^5$ $\Omega$/cm or less can be obtained. When the amount as converted into the weight of the metal, is in the neighbourhood of $10^{-10}$ g/m, the coated layer becomes discontinuous showing elevated electric resistance. Electric resistivities of $10^5$ $\Omega$/cm or less can be obtained in case where the surfaces of fibers are coated with the substantially continuous layer of the metal compound. The thickness of such a layer is in the order of 0.1–20 $\mu$.

The fibers having the metal compound made to adhere thereonto can be in the form of monofilament, multifilament, cord, in some instance, tow or staple fiber. The denier of monofilament of the above-mentioned form of fibers is commonly in the range of 2–20,000 denier. It goes without saying that it can be selected according to the application field where the conductive fibers are used. Accordingly, the denier should not be construed as limitative. In the present invention, an embodiment of conductive fibers of sheath and core type composite structure in which the metal compound is supported on the surface of the sheath of polyamide polymers, is a most advantageous one. The polyamide polymers enable to firmly support the metal compound on the surface whereby resistance against detachment is increased and permanent conductivity is ensured. Core components can be selected from any melt-spinnable polymers such as polyamides, polyesters, polyolefins, etc.

The conductive synthetic fibers of the present invention can be obtained by making metal powder uniformly adhere on the surface of thermoplastic synthetic resin fibers, and then oxidizing said metal powder.

The adhesion of metal powder on the surface of the fibers as the first step, can be attained by a process in which filaments or bundles of filaments of thermoplastic synthetic fibers are in advance sprinkled with metal powder and then bringing the surface layer of the fiber section into molten state by heating to make said metal powder adhere thereonto, or another process in which filaments or bundles of filaments are passed through a vessel containing metal powder. Of these two methods, the former is advantageous. It is difficult in case of bundles of filaments to bring only the surface parts of each filament into molten state and maintain this state further in the incorporating step of metal powder. In such a case, there is a fear of impairing mechanical properties of fibers.

There is difference in adhesive property of metal powder depending upon the kinds of polymers constituting the fibers. The use of fibers having a sheath and core cross-sectional structure is most advantageous in industrial operation. Namely, fibers are prepared through composite spinning by using as the sheath component, a polymer having a lower melting point, then attaching metal powder onto said fibers and making the metal powder adhere onto the fibers at the time of the attachment or by subsequent heating at a temperature higher than the melting point of the sheath polymer.

From the view point of adhesive property and melting point, polyamide polymers are preferable for a sheath polymer. For example, two component or three component copolyamides such as (nylon 6/nylon 66/nylon 610), (nylon 6/nylon 66/nylon 12), (nylon 6/nylon 612) or the like, modified polyamides such as N-alkoxymethyl-nylon 6, N-alkoxymethyl-nylon 66 or the like can be illustrated as such polyamide polymers, but, from the technical standpoint of spinning of composite fibers and adhesive property of metal powder thereto, melt-spinnable copolyamides are most suitable. The kind of thermoplastic high molecular weight substances useful as a core component of the composite fibers, may be varied depending upon the combination thereof with the sheath component, particularly due to the relationship of the melting point of the latter, but in general nylon 6, nylon 66, copolymer of nylon 6 and nylon 66, nylon 610, nylon 612, polyethylene terephthalate, etc. are suitable.

The spinning of sheath and core type composite fibers whose sheath part is a polyamide having heat-melting and adhesive property, is carried out by using a known composite fiber spinning apparatus.

As for the ratio of sheath/core, is selected from the range of 1/5 to 5/1, and 1/5–3/1 is suitable. The ratios less than 1/5 and greater than 5/1 are not good in order to maintain the fiber state and mechanical properties even under the heat during the step of heat adhesion of metal powder and to avoid the mechanical detachment and falling-off of attached metal powder.

Metal powder is preferably of simple substances or alloys of copper, zinc, lead, silver, aluminum or iron. So long as the average particle diameter of the powder is $5\mu$ or less, the smaller the particle size, the more uniform and continuous the adhesion onto the surface of the fibers and also the more stabilized the conductivity of the fibers obtained after the subsequent processing step of oxidation. When the particle size of the metal is greater than $10\mu$, uniform coating by the adhesion onto the surface of the fibers becomes difficult, abrasion resistance of the metal compound layer after the oxidation processing is reduced and effect for reducing electric resistance is lowered.

Both of scale form and spherical form of metal powder can be used. As for the heat treatment temperature of the fibers having metal powder made to adhere thereonto, unless the temperature is the melting point of polymer of fibers or higher, the powder on the surface of fibers is difficult to adhere firmly onto the fibers.

In case of the above-mentioned sheath-core-type composite fibers, it is preferable to select a temperature for treating fiber surface in the range of from the melting point of the sheath component polymer or higher, to the melting point of the core component polymer or lower. When the heat treatment is carried out at a temperature in this range, only the sheath component polymer melts (only the surface part of fibers is melted), to give better adhesion of metal powder and metal foil, and at the same time, the tenacity and the elongation of composite fibers are hardly reduced, because the molecular structure as fiber, of the thermoplastic high molecular weight polymer in the core part, is not disturbed at all.

On the other hand, when the heat treatment is carried out at a temperature lower than the melting point of the sheath component polymer, the melting of fiber surface does not take place, and hence metal powder is not supported firmly on the fiber surface and liable to be detached easily by washing and abrasion. When the heat treatment is carried out at a temperature higher than the melting point of the core component polymer, the thermoplastic high molecular weight polymer in the core part undergoes influence of heat and the molecular structure of fibers is disturbed exceedingly. As a result, break of filaments occurs frequently during the time of heat-adhesion.

The amount of metal powder made to adhere must be such an extent that the surface of fibers is coated uniformly by the metal powder. According to our research, a satisfactory result can be obtained if $10^{-10}$ g or more, preferably $10^{-8}$ g or more per meter of monofilament is made to adhere. In other words, if such an extent of adhesion is carried out, fibers having an electric resistivity of $10^5$ $\Omega$/cm or less can be obtained showing stabilized result. The adhesion amount less than $10^{-10}$ g does not give a continuous coating layer on fibers, and also the conductivity cannot be expected so much. If the above-mentioned amount is carried by fibers, the thickness of the metal powder layer will be in the range of $0.1$–$20\mu$ according to the observation of photographs of electron microscope.

There are various embodiments for the steps of attaching metal powder and making them adhere onto fibers. It is a most desirous step to draw out yarns (raw material yarns for fabrics) having been melt-spun from a spinning nozzle and stretched, from a bobbin, lead them into a vessel containing metal powder and pass the resulting yarns through a heating zone. It is not a preferable process from the view point of the handling of metal powder and physical properties of yarn to make the metal powders adhere onto the fibers having been extruded but not solidified yet in the melt-spinning.

It is also not preferable from the view point of uniform adhesion and not advantageous in the commercial production to make metal powders adhere onto unstretched yarns.

As for the process for attaching metal powder onto fibers, by passing filaments through a vessel containing metal powder, there can be illustrated a process in which filaments are passed through a metal powder layer floating upon a water bath, a process in which filaments are passed through a vessel containing floating heated metal powder to effect simultaneous attachment and heat-adhesion of the metal powder, or the like process.

The following example is a representative thereof which will be described with reference to the accompanying drawings.

Figure 1:
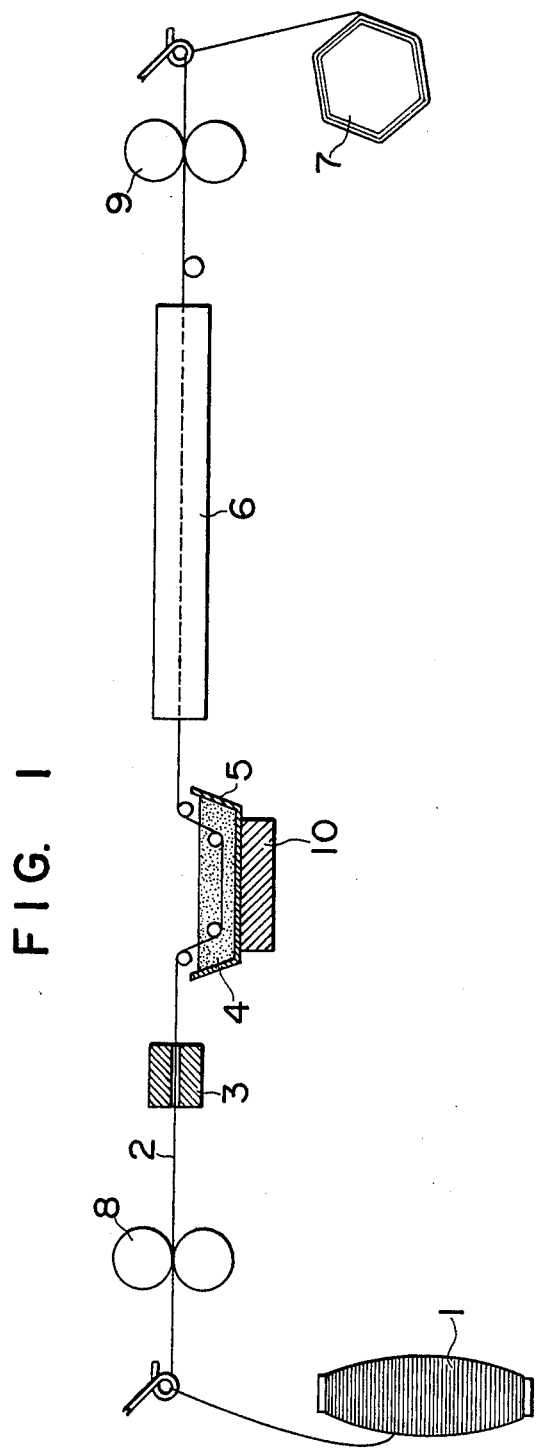
FIG. 1 is a schematic diagram showing a process for making metal powder adhere onto the surface of fibers useful in the process of the present invention.

In FIG. 1, numeral 1 shows a bobbin of raw material filaments, numeral 2 shows unwound filaments, numeral 3 shows a humidifying part, numeral 4 shows metal powder, numeral 5 shows a vessel containing metal powder, numeral 6 shows a heat-treatment cylinder, numeral 7 shows wound-up filaments, numeral 8 shows feed rolls, numeral 9 shows delivery rolls and 10 shows a vibrating apparatus. The filaments 2 unwound through a guide is humidified in the humidifying part 3 and passed through a metal powder vessel 5 filled with metal powder 4 to attach the metal powder onto the surface of the filaments running through the vessel.

Successively the filaments are allowed to run through the inside of the heat-treatment cylinder 6 maintained at a predetermined temperature to melt the surface of fibers and simultaneously to make the metal powder adhere onto the surface of the fibers by heat-melting, and the resulting filaments are taken up as wound-up filaments 7.

The above-mentioned process can be applied either to unstretched yarns or stretched yarns depending upon whether a tension is applied to the composite filaments running through the heat-treatment cylinder.

Thus obtained yarns having metal powder made to adhere thereto has an electric resistivity of at most $10^{10}$ $\Omega$/cm when viewed only from the standpoint of conductivity. It cannot be helped to say that performance as conductive fibers is still low. By subjecting the metal powder made to adhere to the surface of fibers by heat, to subsequent oxidation treatment, conductive fibers can be obtained.

The oxidation treatment of metal powder referred to herein is the treatment carried out to increase the oxidation number of metal powder from zero toward plus side.

For example, it means to subject a metal powder to oxidation treatment to convert into its oxide, sulfide, carbonate, etc.

The method for treating the fibers processed with metal is very simple. Only an application of a known chemical reaction thereto will be sufficient. The step should be selected depending upon the kind of the oxidation treatment and chemical reactivity.

For example, in case of sulfurization treatment of fibers having copper powder made to adhere thereto, since the rate of the sulfurization treatment is extremely rapid, the objective treatment can be attained simply by contacting the fibers having the metal powder made to adhere thereto, with humid hydrogen sulfide gas, successively to the attachment treatment of the metal powder.

In case of oxidation treatment of a narrow meaning, the object can be attained by allowing fibers having metal powder made to adhere, to stand in the atmosphere of oxygen gas at a high temperature under a humid condition for 2 to 7 days. In this case, since the oxidation treatment rate is slow, it is preferable to wind up on a skein or the like and subject to the treatment in a batch manner.

In general as for the conductivity of metals, a good conductivity is shown in the state of metal bond i.e. in case of zero oxidation number. In case of compounds of metals, i.e. in case of a plus oxidation number, the conductivity effect is exceedingly reduced, but to be surprising enough, and to the contrary to generally accepted conventional idea, the fibers obtained by the processing with metal according to the present invention have, after the oxidation treatment, an exceedingly increased conductivity, i.e. only as low an electric resistivity as $10^5$ $\Omega$/cm or less.

The conductive fibers obtained according to the present invention have the possibility of usefulness in wide varieties of application by making the most of superior electric conductivity.

For example, it is possible to solve the problem of basic troubles of synthetic fibers due to the static electricity in the atmosphere of low humidity which troubles have been the greatest drawback for synthetic fibers, merely by blending thereinto a small amount of the conductive fibers of the present invention.

As examples of special utility, fabrics made of the fibers of the present invention can be used for a protecting clothes for workers under a high voltage power transmission and a high electromagnetic field, easy shielding fabrics for protecting harmful electromagnetic effect at the time of precise measurement, etc., by utilizing the very efficient shielding effect of microwaves as shown in Table 1.

Table 1

| Fabrics comprising the conductive fibers of the present invention | Percentage transmission of microwave | Percentage reflection of microwave |
| --- | --- | --- |
| Fibers coated with copper sulfide | 0.2% | 99.8% |

Condition of measurement: a microwave having a frequency of 9 G.H.Z. is sent from a location apart by a distance of 20 m to a receiver enclosed in a fabric. Percentage transmission was measured from the intensity of oscillation of the caught microwave.

Further it is possible to use the products of the present invention as raw materials for curtains and snow-melting-tent having a heating mechanism by utilizing such a low electric resistivity as $10^3$ $\Omega$/cm.

As above-mentioned, conductive fibers useful in wide varieties of application field can be provided economically only by a combination of extremely simple steps.

Following examples are given to illustrate the present invention but it is not intended to limit the scope.

EXAMPLE 1

Dried chips of Nylon 6 (relative viscosity as measured in 98% sulfuric acid at 25°C : 2.42, m.p. : 218°C) and copolyamide of nylon 6/nylon 612 (mol ratio of 65/35; relative viscosity as measured in 98% sulfuric acid at 25°C : 2.52; m.p. : 148°C) were separately melted at 280°C and 240°C, respectively, and subjected to composite spinning using a sheath and core type composite spinning machine to prepare composite filament yarns of concentric sheath and core type consisting of a core of nylon 6 and a sheath of the copolyamide with a sheath to core ratio of 2:1 by weight which were stretched to 3.5 times the original length according to a conventional method to give composite filament yarns of 70 d/9 f.

Then brass powder having an average diameter of $2\mu$ and a composition of Cu/Zn of 70/30 by weight was made to adhere by heating, to the surface of the resulting composite filament fibers through the processing step of FIG. 1. Namely, composite yarns 2 were allowed to run through the inside of a powder container 5 provided with a vibration apparatus 10 and containing brass powders 4 composed of 70 parts by weight of copper and 30 parts by weight of zinc (mean particle diameter of $2\mu$) at a velocity of 50 m/min., successively led to a heating cylinder 6 having an inner diameter of 70 mm and a length of 1500 mm and taken up at a velocity of 60 m/min.

By setting temperatures of the inside of the heating cylinder at 130°C, 190°C and 220°C, the melt-adhesion property of brass powder was estimated. As a result, at temperatures of 130°C and 190°C, the yarns were taken up without any troubles, but, at 220°C, yarn breakage very often occurred and take-up was difficult.

The resulting yarns having the metal powder made to adhere thereonto (which will be hereinafter abbreviated as metal powder-carrying fibers) were washed for 10 minutes with stirring three times with a 5% (by weight) aqueous solution of a neutral detergent with a bath ratio of 1:50, followed by water-washing five times. Thereafter, the amount of metal powder made to adhere onto the surface of the fibers was measured. The results are shown in Table 2.

In case of the heat-treatment at 130°C, brass powder adhered only from place to place, while when the yarns were heated at 190°C and 220°C, the surface of the yarns was completely coated with brass powder showing splendid yellowish red luster of brass. Further, the tenacities and elongations of the metal powder-carrying yarns obtained in this example were measured and the results are shown also in Table 2. As seen in the table, in case of heating at 220°C, the tenacity and elongation were both remarkably reduced.

This is due to too high a temperature at the time of adhesion by heating which has disturbed the fiber form of core component of nylon 6.

Resultant brass powder-carrying yarns were taken up on skeins each in an amount of 50 g. and allowed to stand in the atmosphere of a desiccator having a relative humidity of 100%, a partial pressure of 300 mmHg of $H_2S$ at room temperature whereby the brass powder on the surface of the fibers was sulfurized showing a characteristic black color of metal sulfide. After sulfurizing treatment for 2 hours in said atmosphere, sulfurized brass-carrying yarns were washed with water twice and dried at 105°C for 5 hours. After drying, the electric resistances of said metal-carrying yarns were measured in a thermostat at room temperature (25°C) and a relative humidity of 40% with an electric resistance measurement instrument TR-6S type of Takeda Riken Kabushiki Kaisha. Similar measurement was carried out with regard to the metal powder-carrying yarns before sulfurizing.

The result obtained is shown also in Table 2. The metal-carrying fibers having brass powder made to adhere by melting at 190°C and 220°C showed only an electric resistivity in the order of $10^{10}$ Ω/cm at the highest value in spite of the fact that the surfaces of the fibers are apparently wholly covered by brass powder (refer to FIG. 2). On the other hand, the brass powder-carrying fibers after the treatment of sulfurizing showed as extremely low a value of electric resistivity as in the order of $10^2$ Ω/cm.

Figure 2:
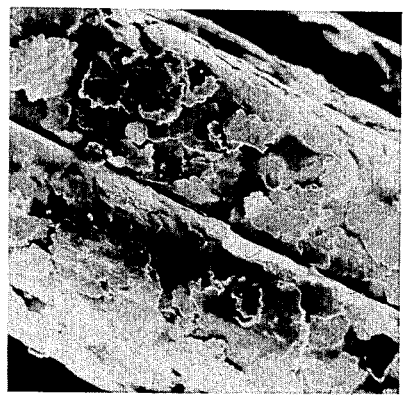
FIG. 2 is an electron microscopic photograph of the fibers having brass powder made to adhere thereto (taken by a scanning type electron microscope).
Figure 3:
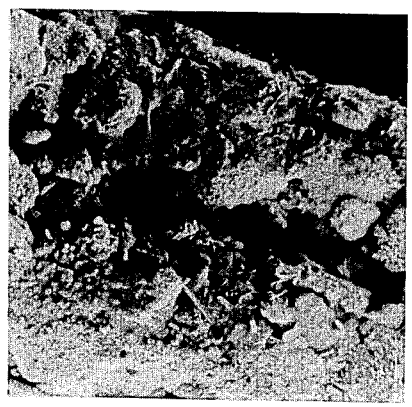
FIG. 3 is also an electron microscopic photograph of the fibers having brass powder made to adhere thereto and then sulfurized (taken by the same microscope).

FIGS. 2 and 3 are photographs (taken by a scanning type electron-microscope (JSM-U3 type of Nippon Denshi K.K., magnification of 1050) ) of the surfaces of the metal powder-carrying fibers obtained by melt-adhesion of brass powder at 190°C and the same surfaces after sulfurizing treatment.

It is evident that there is a notable difference between FIGS. 2 and 3. In FIG. 2, scale-form powders of brass are piled up one above another completely covering whole fiber surface but there is more or less gaps between each powder. However in FIG. 3, it is a characteristic feature of this case that sulfurization of brass powder not only changes the surface form of individual powder but also reduces the gap between each powder.

It is assumed that such a strange phenomenon as the fact that fibrous metal compound shows better electric conductivity in spite of the fact that oxidized substances of metals are poorer in electric conductivity than metals or alloys, is caused in part by a continuation of metal powder on the surface of fibers. It is also assumed that the metal on the fiber surfaces is electrically charged because of its oxidized state, and as a result, molecules of water, carbon dioxide or the like having polarity are coordinated secondarily with the metal particles therebetween to promote the flow of current.

Table 2

| Temperature of the surface of yarns | Amount of brass attached (g/m) | Tenacity | Elongation | electric resistivity (Ω/cm) before sulfurizing | after sulfurizing |
|---|---|---|---|---|---|
| Untreated yarns | 0 | g/d 3.7 | 28% | $10^{12}$ Ω/cm or more | $10^{12}$ Ω/cm or more |
| Yarns heat-treated at 130°C | $10^{-13}$ or less | 3.8 " | 25% | $10^{12}$ or more | $10^{12}$ or more |

Table 2-continued

| Temperature of the surface of yarns | Amount of brass attached (g/m) | Tenacity | Elongation | electric resistivity (Ω/cm) before sulfurizing | after sulfurizing |
|---|---|---|---|---|---|
| Yarns heat-treated at 190°C | $5.6\times10^{-5}$ | 3.1 " | 24% | $3\times10^{10}$ | $3\times10^2$ |
| Yarns heat-treated at 220°C | $6.3\times10^{-5}$ | 1.2 " | 13% | $5\times10^{10}$ | $8\times10^2$ |

COMPARATIVE EXAMPLE 1

Dried nylon 6 chips (relative viscosity as measured in 98% sulfuric acid at 25°C : 2.42, m.p. : 218°C) were subjected to melt-spinning, followed by stretching to give monofilaments of 150d having a tenacity of 3.88 g/d and an elongation of 25%.

The above-mentioned fibers were subjected to an adhesion test of brass powder having a mean particle diameter of 2μ (composition of copper/zinc of 70/30 by weight) in a similar manner to that of Example 1. As a result, when the temperature in a heating cylinder was below 210°C, almost no adhesion of the powder onto the fiber surface occurred, while, when the heat-treating temperatures were elevated above 210°C and the resulting fibers were taken up, fiber breakage very often occurred and continuous take-up became difficult. The tenacity of fibers subjected to adhesion by heating at a surface temperature of 220°C as measured was 2.16 g/d, that is, the reduction in tenacity was remarkable.

However, the metal powder-carrying fibers obtained by making brass powder adhere by heating at 220°C had an amount of brass powder made to adhere, of 4.3 $\times 10^{-5}$ g/m, and after the sulfurizing treatment, superior conductive fibers having an electric resistivity of 3 $\times 10^2$ Ω/cm were obtained.

EXAMPLE 2

Composite filament yarns of concentric sheath and core type having a sheath/core ratio of 1:1 consisting of various kinds of thermoplastic high molecular weight polymers as shown in Table 3 were prepared using a conventional sheath and core type composite-spinning machine, followed by stretching according to a conventional method to give stretched composite yarns of $70^d/9^f$. As in Example 1, brass powder having a copper/zinc ratio of 70/30 by weight and a mean particle diameter of 2μ was allowed to adhere by heating onto the surface of the resulting yarns using the apparatus of FIG. 1, and the heat-adhesiveness of the powder to the composite yarns were observed by a microscope. The temperature of the surface of the filament yarns was about 20°C lower than the respective melting points of the thermoplastic high molecular weight polymers of the core at the time of treatment in the heating cylinder.

As for the adhesiveness of the metal powder onto the high molecular weight polymers, fastnesses to rubbing by washing were examined. The results are shown in Table 3. When the sheath of composite filament yarns was of polyethylene, polypropylene or polyesters, peeling-off of the metal powder by rubbing by washing due to the weak adhesiveness of the powder onto the polymers was observed.

On the other hand, in case of polyamide, no peeling-off of the powder by rubbing during the time of washing occurred due to the superior adhesiveness of the powder onto polyamides.

Accordingly, in order to obtain conductive yarns having a superior durability, it is preferable to utilize a high molecular weight polymer of polyamide group having a superior adhesiveness of metal powders thereto.

After washing with a solution of a detergent three times and with water five times, each 50 g of metal powder-carrying fibers was subjected to sulfurizing treatment as in Example 1 and their electric resistivities were measured. The results are shown in Table 3.

by mol) as a sheath component. The fiber surface of the resulting metal powder-carrying yarns, were uniformly coated by metal powder, each showing characteristic luster of metal powder, and even after three times washings with a 5% aqueous solution of a neutral detergent and five times washing with water, no peeling-off of metal powder was observed. The amount of adhesion was $10^{-5}$–$10^{-3}$ g/m.

The electric resistivities after washings, of the metal powder-carrying yarns, were measured using an electric resistance-measuring instrument of TR-6S type (manufactured by Takeda Riken K.K., Japan) under the atmosphere of relative humidity of 40% and temperature of 25°C. As a result, as shown in Column 4 of Table 3

| High molecular weight polymer of sheath component | High molecular weight polymer of core component | Surface temperature of fibers | Amount of brass powder attached (g/m) | | | | Electric resistivity after sulfurizing treatment ($\Omega$/cm) |
|---|---|---|---|---|---|---|---|
| | | | before washing | | | | |
| Polyethylene (1) MI=22 MP=137°C | Nylon 6 $\eta r$ =2.42 Mp=218°C | 190°C | 2.2× $10^{-5}$ | 4× $10^{-8}$ | 1.5× $10^{-8}$ | 6.7× $10^{-9}$ | 8.6×$10^4$ |
| Polypropylene (1) MI=36 MP=176°C | Nylon 66 $\eta r$ =2.42 Mp=25.7°C | 227°C | 2.4× $10^{-5}$ | 1.3× $10^{-7}$ | 3.4× $10^{-8}$ | 1.7× $10^{-8}$ | 3.5×$10^4$ |
| Copolyester (3) (2) [$\eta$]= 0.63 Mp=202°C | Polyethylene terephthalate (2) [$\eta$]=0.82 Mp=259°C | 235°C | 6.4× $10^{-5}$ | 7.8× $10^{-6}$ | 5.3× $10^{-7}$ | 8.4× $10^{-8}$ | 2.2×$10^4$ |
| Copolyamide (4) $\eta r$ =2.52 Mp=140°C | Nylon 6 $\eta r$ =2.42 MP=218°C | 190°C | 7.8× $10^{-5}$ | 6.3× $10^{-5}$ | 6.1× $10^{-5}$ | 5.4× $10^{-5}$ | 1.3×$10^3$ |

(1) MI means a melt index at 200°C.
(2) [$\eta$] is an intrinsic viscosity as measured in ortho-chlorophenol solution at 35°C.
(3) Copolyester of terephthalic acid, adipic acid and ethylene glycol
(4) Copolyamide of nylon 6 and nylon 6, 12

EXAMPLE 3

Copper powder (mean particle diameter of 1.5$\mu$), zinc powder (mean particle diameter of 1.5$\mu$), brass powder (mean particle diameter of 2$\mu$), aluminum powder (mean particle diameter of 2$\mu$), iron powder (mean particle diameter of 3$\mu$), silver powder (mean particle diameter of 1.5$\mu$) and lead powder (mean particle diameter of 3$\mu$) were respectively made to adhere by heating at 210°C all through the processing steps of FIG. 1, onto the surface of composite filament yarns consisting of polyethylene terephthalate (intrinsic viscosity [$\eta$] as measured in o-chlorophenol at 35°C:0.82, m.p.: 259°C) as a core component and three component-copolyamide of nylon 6/nylon 66/nylon 612 (relative viscosity $\eta_r$ as measured in 98% sulfuric acid at 25°C:2.48, m.p.:153°C, composition: 50/20/30

Table 4, the electric resistivities of the metal powder-carrying yarns were unexpectedly high, that is, as high as $10^{10}$ $\Omega$/cm, in spite of the good electric conductivities of the metals themselves, as shown in Column 2 of Table 4. Thus, a product to be called conductive yarns could not be obtained.

The respective metal powder-carrying yarns as above-mentioned were reeled each in an amount of 100 g, and the resulting skeins were allowed to stand at room temperature, and relative humidity of 100% in an atmosphere having a partial pressure of hydrogen sulfide of 500 mmHg. The metal powder on the fiber surface was at once subjected to sulfurizing whereby the color changed to black characteristic of metal sulfides. Conversion of the metal powder into sulfide was about 90~95%.

After the sulfurizing treatment of the metal powder on the fiber surface for two hours in a desiccator, the skeins were taken out and water-washed. Almost no peeling-off of metal sulfides occurred.

Then, drying was carried out at 105°C for 6 hours, and the electric resistances of the yarns coated by metal sulfide were measured as in Example 1.

The results are shown in Column 5 of Table 4.

In spite of the fact that the conductivities of simple substances of metals are reduced by oxidation, the yarns coated by metal sulfide had, to be surprising enough, a 100,000 times or more the conductivities of the yarns coated by the metal powder.

EXAMPLE 4

The composite yarns of concentric sheath and core type consisting of a heat-melt-adhesive polyamide of a low melting point (m.p. 153°C) as a sheath component and polyethylene terephthalate (m.p. 259°C) as a core component (having a sheath core ratio of 2:1), obtained in Example 3, were subjected to adhesion of copper powder thereto using the apparatus of FIG. 1, and successively the copper powder (mean particle diameter of $1.5\mu$) on the fiber surface was subjected to sulfurizing treatment with hydrogen sulfide gas.

Namely, composite yarns 2 were allowed to run through the inside of a powder container 5 provided with a vibration apparatus 10 and containing copper powder 4 (mean particle diameter of $1.5\mu$) at a velocity of 50 m/min., and then led to a heat-treatment cylinder 6 having an inner diameter of 70 mm and a length of 1500 mm, wherein copper powder was made to adhere by heating onto the fiber surface having a temperature of 230°C. Successively, the copper powder-carrying yarns were led into a chamber containing hydrogen sulfide gas, at an inner temperature of 60°C and a relative humidity of 100%, and wound up on a reel made from nylon and having a radius of 400 mm, in the atmosphere of hydrogen sulfide gas. After reeling by about 500 g, the yarns were retained in the atmosphere of hydrogen sulfide gas further for 10 minutes.

After complete purging of hydrogen sulfide gas, the resulting skein was taken out. It was found that the fiber surface was completely coated with black copper sulfide. The adhesion amount was $2.7 \times 10^{-4}$ g based on copper. The yarns coated with copper sulfide were dried, and their electric resistivity was measured. It was $9 \times 10^2$ $\Omega$/cm. Namely, the resulting yarns had a superior conductivity.

EXAMPLE 5

The respective metal powder-carrying yarns obtained in Example 3, were wound up each on a reel by 100 g, and allowed to stand for seven days in an atmosphere having a partial pressure of oxygen gas of 400 mmHg at a relative humidity of 100%, and a temperature of 80°C, until the metal powder on the fiber surface completely turned into the characteristic color of oxide of the metal. After the oxidation treatment, the resulting yarns coated with metal oxides were dried at 105°C for 6 hours; and their electric resistances were measured. The results are shown in Table 4. As seen in Column 7 of Table 4, conductive yarns having a remarkably reduced electric resistance were obtained.

EXAMPLE 6

Similarly to Example 3, powder of copper sulfide or copper oxide was made to adhere onto composite filament yarns of concentric sheath and core type consisting of polyethylene terephthalate (m.p. 259°C) as a core component and a heat-melt-adhesive copolyamide having a low melting point (m.p. 153°C) as a sheath component (sheath/core ratio of 2:1 and the adhesion amounts based on copper were $8.6 \times 10^{-5}$ and $1.2 \times 10^{-4}$, respectively), and the electric resistances of the resulting yarns were measured. The results are shown in Table 4. As seen in Columns 6 and 8 of Table 4, the measured values were similar to those of Examples 3 and 4.

As seen from this example, the yarns coated with metal compounds show a notably superior effectiveness to the yarns coated with metal powders.

EXAMPLE 7

The respective composite yarns onto which powder of copper, zinc or silver were allowed to adhere, obtained in Example 3, were wound up each on a reel by 100 g, and the metal powder on the fiber surface was subjected to chlorination treatment in an atmosphere having a relative humidity of 100% and a partial pressure of chlorine gas of 100 mmHg. After the chlorination treatment, the resulting skeins were taken out and washed with water. As a result, water-soluble copper chloride (green) and zinc chloride (colorless) absorbed a large amount of water and when washed with water, they are washed away, and the yarns returned to the original mere composite yarns.

On the other hand, in the case of silver chloride (yellowish white color) which is hardly soluble, it was not washed away by water-washing carried out one time.

As seen from this example, hardly soluble or insoluble metal compounds are preferable as the metal compounds (oxidized products of metals) from the viewpoint of fastness to washing.

Table 4

| Kind of metals | | Copper | Zinc | Brass | Aluminum | Iron | Silver | Lead |
|---|---|---|---|---|---|---|---|---|
| Electric resistivity of simple substance of metal | | $1.72 \times 10^{-6}$ $\Omega$/cm | $6 \times 10^{-6}$ | $5-7 \times 10^{-6}$ | $2.75 \times 10^{-6}$ | $9.8 \times 10^{-6}$ | $1.62 \times 10^{-6}$ | $2.1 \times 10^{-5}$ |
| Adhesion amount of metal powder | | $1.8 \times 10^{-4}$ g | $1.6 \times 10^{-4}$ | $2.0 \times 10^{-4}$ | $5.4 \times 10^{-5}$ | $1.03 \times 10^{-5}$ | $2.5 \times 10^{-4}$ | $2.3 \times 10^{-4}$ |
| Yarns coated with metals | Ex. 3 | $3-4 \times 10^{10}$ $\Omega$/cm | $8 \times 10^{11}$ | $1 \times 10^{11}$ | $2 \times 10^{11}$ | $8 \times 10^{11}$ | $8-9 \times 10^9$ | $2 \times 10^{10}$ |
| Electric resistivity of yarns | Ex. 3 | $7 \times 10^2$ $\Omega$/cm | $1 \times 10^3$ | $9 \times 10^2$ | | $6 \times 10^3$ | $5-6 \times 10^3$ | $8 \times 10^3$ |
| coated with metal sulfide | Ex. 6 | $8 \times 10^4$ $\Omega$/cm | | | | | | |
| Electric resistivity | Ex. 5 | $2 \times 10^3$ $\Omega$/cm | $6 \times 10^3$ | $3 \times 10^4$ | $7 \times 10^4$ | $8 \times 10^4$ | $6 \times 10^3$ | $6 \times 10^3$ |

Table 4-continued

| Kind of metals | | Copper | Zinc | Brass | Aluminum | Iron | Silver | Lead |
|---|---|---|---|---|---|---|---|---|
| of yarns coated with metal oxide (in a narrow sense) Electric resistivity | Ex. 6 | $8 \times 10^4$ | | | | | | |
| of yarns coated with metal carbonate Electric resistivity | Ex. 7 | Washed away | Washed away | | | | $8 \times 10^3$ Ω/cm | |
| of yarns coated with metal carbonate | | $7 \times 10^3$ | $2 \times 10^4$ | $9 \times 10^3$ | | $1 \times 10^5$ | | $3 \times 10^4$ |

EXAMPLE 8

Composite yarns coated with copper sulfide, obtained in Example 4, were arranged together with raw yarns of nylon 66 of $840^d/48^f$ for carpet and tufted into a carpet. As for conditions of arrangement, one of the yarns coated with copper sulfide per 10 yarns of nylon 66 was tufted. Further, for comparison, commercially available conductive yarns (electric resistivity : 10 Ω/cm) silver-plated according to a chemical plating method were similarly mixed and tufted into a carpet.

The electric charge of the carpets thus prepared was measured at a relative humidity of 30%, according to the measurement method of "The body voltage build-up for the carpet" proposed by "American Carpet Institute Subcomittee". The results are shown in Table 5. As apparent from this Table, the conductive yarns according to the present invention have an conductivity comparable to those according to a chemical plating method.

Table 5

| Sample | Charged voltage in human body |
|---|---|
| Carpet of nylon 66 yarns | 5000 V |
| Carpet of nylon 66 yarns arranged with those coated with copper sulfide | 200 V |
| Carpet of nylon 66 yarns arranged with silver-plated conductive yarns | 160 V |
| Carpet of wool | 1800 V |

Note:
According to the above-mentioned measurement method, carpets having a charged voltage in human body, of 1000 V or lower are deemed preferable.

What is claimed is:

1. Conductive synthetic fibers having an electric resistivity of $10^5$ Ω/cm or less, and consisting of fibers of thermoplastic synthetic polymer and, adhered directly to the surface thereof, a substantially continuous layer consisting of oxidized metal particles, wherein said metal particles are oxidized in the broad sense, produced by a process comprising
   1. heating sheath-core synthetic fibers wherein the sheath has a lower melting point than the core to soften the sheath,
   2. depositing metal powder upon the heat-softened sheath,
   3. cooling the sheath to bind the metal particles which were deposited thereon when it was in a heat-softened state, and
   4. subjecting the atmosphere-exposed bound metal particles to an oxidation treatment in a broad sense.

2. Conductive synthetic fibers according to claim 1 wherein the metal powder is selected from the group consisting of copper, zinc, lead, silver, aluminum, iron and alloys thereof.

3. Conductive synthetic fibers according to claim 1 wherein the oxidized metal particles are selected from the group consisting of metal sulfides and metal oxides.

4. Conductive synthetic fibers according to claim 1 wherein at least the surface portion of said synthetic fibers consists of a polyamide.

5. A conductive synthetic fiber according to claim 1 wherein the oxidized metal particles are copper sulfide and said thermoplastic synthetic polymer fiber comprises polyamide.

6. A method for producing conductive fibers having an electric resistivity of $10^5$ Ω/cm or less which comprises (1) heating sheath-core synthetic fibers wherein the sheath has a lower melting point than the core to soften the sheath, (2) depositing metal powder upon the heat-softened sheath, (3) cooling the sheath to bind the metal particles which were deposited thereon when it was in a heat-softened state, and (4) subjecting the atmosphere-exposed bound metal particles to an oxidation treatment in a broad sense.

7. A method for producing conductive fibers according to claim 6 wherein at least the surface portion of the synthetic fibers consists of a polyamide.

8. A method for producing conductive fibers according to claim 6 wherein the metal powder is selected from the group consisting of copper, zinc, lead, silver, aluminum, iron and alloys thereof.

9. A method for producing conductive fibers according to claim 6 wherein the oxidation treatment in a broad sense results in sulfide formation.

10. A method for producing conductive fibers according to claim 6 wherein the oxidation treatment in a broad sense results in oxide formation.

11. A method for producing conductive fibers according to claim 6 wherein the attachment of metal powder to the surface of synthetic fibers is carried out after water has been attached onto said fibers.

* * * * *